(12) United States Patent
Omura

(10) Patent No.: US 8,648,673 B2
(45) Date of Patent: Feb. 11, 2014

(54) ELASTIC WAVE APPARATUS WITH A FLOATING WIRING LINE ON A BASE SUBSTRATE

(75) Inventor: Masashi Omura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/606,364

(22) Filed: Sep. 7, 2012

(65) Prior Publication Data

US 2012/0326810 A1 Dec. 27, 2012

Related U.S. Application Data

(63) Continuation of application No. PCT/JP2011/051169, filed on Jan. 24, 2011.

(30) Foreign Application Priority Data

Mar. 11, 2010 (JP) ................................ 2010-054074

(51) Int. Cl.
*H03H 9/64* (2006.01)
*H03H 9/08* (2006.01)
*H03H 9/72* (2006.01)

(52) U.S. Cl.
USPC ......................................... 333/193; 333/195

(58) Field of Classification Search
USPC ........... 333/133, 193–196; 310/313 B, 313 D
See application file for complete search history.

(56) References Cited

U.S. PATENT DOCUMENTS

2003/0058064 A1 3/2003 Nakano
2005/0264375 A1 12/2005 Ikuta et al.

FOREIGN PATENT DOCUMENTS

| JP | 10-256869 | * | 9/1998 |
| JP | 2000-183679 | * | 6/2000 |
| JP | 2000-196407 A | | 7/2000 |
| JP | 2002-368574 A | | 12/2002 |
| JP | 2003-101374 A | | 4/2003 |
| JP | 2006-14096 A | | 1/2006 |
| JP | 2007-116628 A | | 5/2007 |

OTHER PUBLICATIONS

Official Communication issued in International Patent Application No. PCT/JP2011/051169, mailed on Mar. 22, 2011.

* cited by examiner

*Primary Examiner* — Barbara Summons
(74) *Attorney, Agent, or Firm* — Keating & Bennett, LLP

(57) ABSTRACT

A small-sized elastic wave apparatus in which heat generated at a portion of a cascade connection between resonators is sufficiently dissipated includes on one main surface of a piezoelectric substrate in an elastic wave filter mounted on a base substrate on which an input/output wiring line, a ground wiring line, and a floating wiring line insulated from the input/output wiring line and the ground wiring line are provided, first electrodes coupled to the input/output wiring line or the ground wiring line, second electrodes coupled to the floating wiring line, resonators, connection wiring lines connecting the resonators, and electrode wiring lines connecting the resonators and the first electrodes. The second electrodes are disposed in contact with the connection wiring lines cascading the resonators.

5 Claims, 8 Drawing Sheets

ELASTIC WAVE APPARATUS WITH A FLOATING WIRING LINE ON A BASE SUBSTRATE

BACKGROUND OF THE INVENTION

1. Field of the Invention

The present invention relates to elastic wave apparatuses, and, more particularly, to an elastic wave apparatus including a base substrate and an elastic wave filter provided with cascaded resonators.

2. Description of the Related Art

In order to cause an elastic wave apparatus including an elastic wave element using an elastic wave such as a surface acoustic wave or a boundary wave to efficiently perform heat dissipation, a method of disposing a heat-dissipation dummy electrode has been proposed.

For example, as illustrated in a block diagram in FIG. 13, each of surface acoustic wave filters $F_1$ and $F_2$ includes resonators 117. An input electrode 118, an output electrode 119, and ground electrodes 120, which are electrodes related to the electrical operations of the resonators 117, are connected to the resonators 117 via wiring lines 121. Heat-dissipation electrodes 122 that are not related to the electrical operations of the resonators 117, that is, dummy electrodes, are formed. The resonator 117 includes a comb-shaped IDT electrode 117a and reflectors 117b. Some of the heat-dissipation electrodes 122 are directly connected to the reflectors 117b, some of them are electrically connected to the reflectors 117b via the wiring lines 121, and some of them are provided independently of the resonators 117 and the electrodes 118, 119, and 120.

As illustrated in a cross-sectional view in FIG. 14, a blanching filter 110 including the surface acoustic wave filters $F_1$ and $F_2$ is provided with a mount board 111. The mount board 111 includes an element mount layer 111a on which the two surface acoustic wave filter $F_1$ and $F_2$ are mounted, a ground layer 111b at which a ground electrode is formed, a circuit forming layer 111c at which a high-frequency circuit such as a phase matching circuit is formed, and a substrate connection layer 111d at which a common ground electrode and external connection terminals 112 are formed, and is made of ceramics or a resin. The surface acoustic wave filters $F_1$ and $F_2$ are hermetically sealed with a cap 113, thereby being packaged. The layers included in the mount board 111 are electrically connected via through-hole conductors, via-hole conductors, or wiring lines 115 including side wall wiring lines formed on side surfaces. On the surfaces of the layers, the wiring lines 115, such as microstrip lines, are formed.

The mount board 111 and the input electrode 118, output electrode 119, ground electrodes 120, and heat-dissipation electrodes 122 of the resonators 117 are connected via projecting electrodes 114 illustrated in FIG. 14. The heat-dissipation electrodes 122 are electrically connected to a wiring line other than an input wiring line and an output wiring line formed at the mount board 111, that is, a wiring line connected to the ground electrode of the mount board 111 or a wiring line that is merely routed and has an unstable potential (see, for example, Japanese Unexamined Patent Application Publication No. 2003-101374).

Since the heat-dissipation electrodes 122, which are different from the input electrode 118, the output electrode 119, and the ground electrodes 120, are disposed at electrically unrelated positions in each of the surface acoustic wave filters $F_1$ and $F_2$, it is difficult to miniaturize the elastic wave apparatus illustrated in FIGS. 13 and 14.

Since no electrode that produces a heat-dissipation effect is not connected to the interstage portion (a portion cascading the resonators 117) that is very prone to reach high temperatures and the number of heat-dissipation paths is small, heat dissipation is not properly performed.

SUMMARY OF THE INVENTION

Preferred embodiments of the present invention provide a small-sized elastic wave apparatus in which heat generated at a portion of a cascade connection between resonators can be sufficiently dissipated.

An elastic wave apparatus according to a preferred embodiment of the present invention includes a base substrate including, on one main surface of a substrate body, an input/output wiring line through which an input signal or an output signal propagates, a ground wiring line connected to a ground, and a floating wiring line insulated from the input/output wiring line and the ground wiring line and an elastic wave filter including, on one main surface of a piezoelectric substrate, a first electrode electrically connected to the input/output wiring line or the ground wiring line located at the base substrate, a second electrode electrically connected to the floating wiring line located at the base substrate, a plurality of resonators, a connection wiring line that connects the plurality of resonators, and an electrode wiring line that electrically connects one of the plurality of resonators and the first electrode. The second electrode is disposed in contact with the connection wiring line that cascades the plurality of resonators.

In the elastic wave apparatus, since the second electrode in the elastic wave filter, which is connected to the floating wiring line in the base substrate, is disposed to be in contact with the connection wiring line that cascades the plurality of resonators, heat generated at an interstage portion between the cascaded resonators, which is very prone to reach high temperatures, is sufficiently dissipated to the base substrate via the second electrode.

With the above-described configuration, a heat-dissipation effect is increased as compared with a case in which a heat-dissipation dummy electrode connected to a wiring line in a base substrate is spaced apart from a connection wiring line cascading resonators. It is possible to easily reduce the size of an elastic wave apparatus. Furthermore, it is possible to firmly mount an elastic wave filter on a base substrate.

The elastic wave filter preferably includes a ladder filter provided on the one main surface of the piezoelectric substrate.

The elastic wave filter preferably includes a transmission filter provided on the one main surface of the piezoelectric substrate.

An external terminal is preferably provided on the other main surface of the substrate body in the base substrate. The external terminal is preferably electrically connected to the input/output wiring line or the ground wiring line and is preferably insulated from the floating wiring line.

In this case, when the elastic wave apparatus is mounted on a mount board or the like, the external terminal located on the other main surface of the substrate body in the base substrate is coupled to the mount board. Since the external terminal and the floating wiring line are insulated from each other, the potential of the floating wiring line is not affected by the potential of the mount board on which the elastic wave apparatus is mounted. Since the elastic wave filter can be mounted on the base substrate irrespective of the potential of the mount board on which the elastic wave apparatus is mounted, a high degree of design flexibility can be obtained.

A first external terminal and a second external terminal are preferably provided on the other main surface of the substrate body in the base substrate. The first external terminal is preferably electrically connected to the input/output wiring line or the ground wiring line, the second external terminal is preferably electrically connected to the floating wiring line, and the first external terminal and the second external terminal are preferably insulated from each other.

In this case, since heat generated at an interstage portion between the cascaded resonators in the elastic wave filter can be externally dissipated from the second external terminal provided on the other main surface of the substrate body in the base substrate, a heat-dissipation effect can be further enhanced.

It is possible to provide a small-sized elastic wave apparatus according to various preferred embodiments of the present invention in which heat generated at a portion of cascade connection between resonators can be sufficiently dissipated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described blow with reference to FIGS. 1 to 12.

First Preferred Embodiment

An elastic wave apparatus 2 according to the first preferred embodiment will be described with reference to FIGS. 1 to 3.

Figure 1:
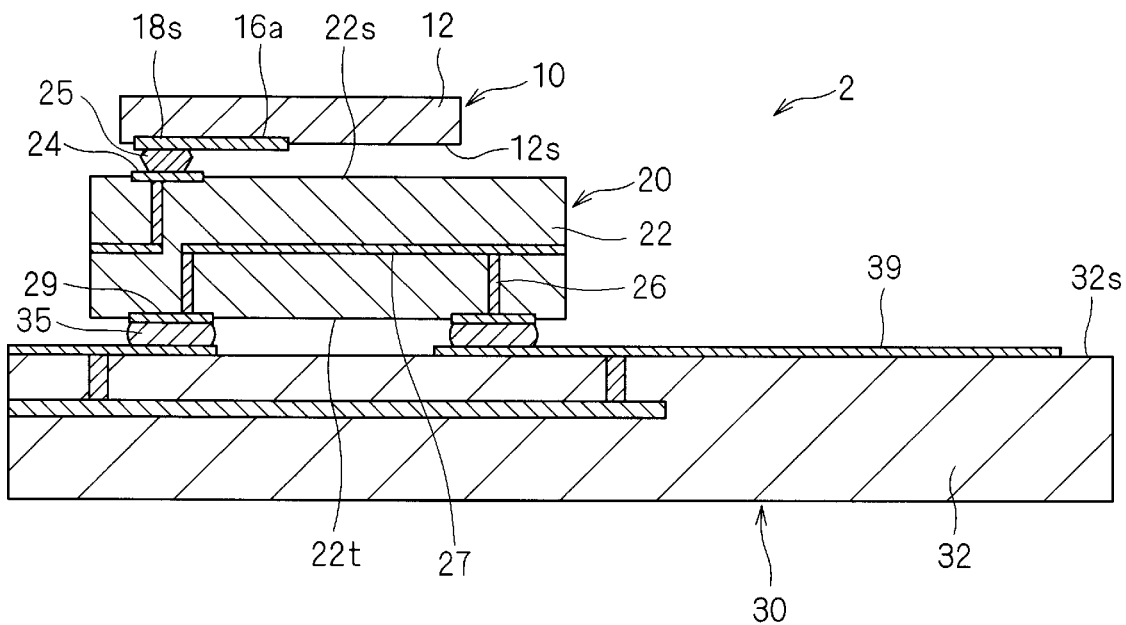
FIG. 1 is a cross-sectional view of an elastic wave apparatus mounted on a mount board according to a first preferred embodiment of the present invention.

FIG. 1 is a cross-sectional view illustrating a state in which the elastic wave apparatus 2 is mounted on a mount board 30. As illustrated in FIG. 1, in the elastic wave apparatus 2, an elastic wave filter 10 is mounted on a base substrate 20. That is, an electrode 18$s$ located on one main surface 12$s$ of a piezoelectric substrate 12 in the elastic wave filter 10 and a wiring line 24 located on one main surface 22$s$ of a substrate body 22 in the base substrate 20 are coupled via, for example, a gold bump 25. An external terminal 29 is located on the other main surface 22$t$ of the substrate body 22 in the base substrate 20. The external terminal 29 is coupled to a mount terminal 39 located on a mount surface 32$s$ of a substrate body 32 in the mount board 30 via, for example, solder 35.

Figure 2:
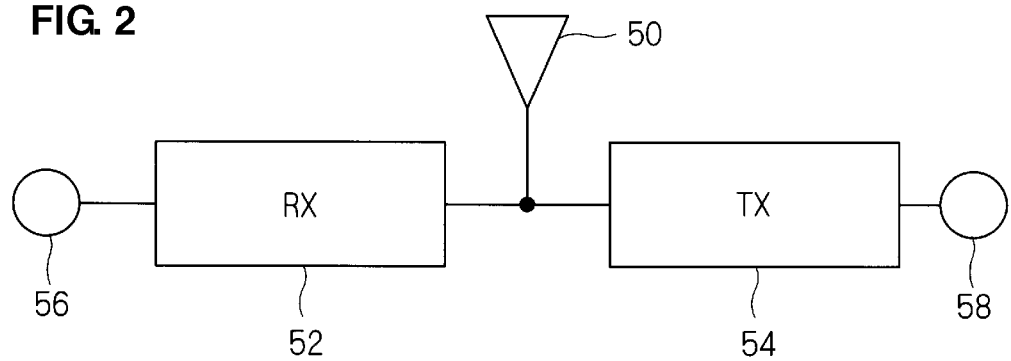
FIG. 2 is a schematic block diagram illustrating the configuration of a duplexer according to the first preferred embodiment of the present invention.

FIG. 2 is a schematic block diagram illustrating the configuration of the elastic wave apparatus 2. As illustrated in FIG. 2, the elastic wave apparatus 2 is a duplexer including a Tx (transmission) filter 54 connected between a Tx terminal 58 and an antenna terminal 50 and an Rx (receiving) filter 52 connected between the antenna terminal 50 and an Rx terminal 56. A Tx filter and an Rx filter may be provided in the elastic wave filter 10 mounted on the base substrate 20 or may be separately provided in different elastic wave filters. In the latter case, a plurality of elastic wave filters are preferably mounted on a base substrate.

Figure 3:
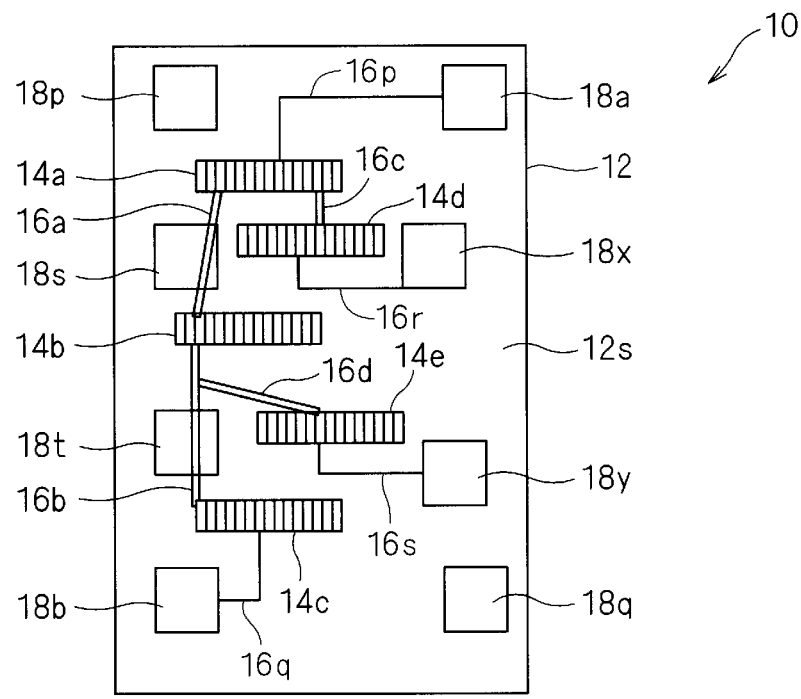
FIG. 3 is a plan view illustrating the configuration of an elastic wave filter according to the first preferred embodiment of the present invention.

FIG. 3 is a plan view illustrating the configuration of the elastic wave filter 10 in which a Tx filter is provided. As illustrated in FIG. 3, in the elastic wave filter 10, on the one main surface 12$s$ of the piezoelectric substrate 12, a plurality of resonators 14$a$ to 14$e$, connection wiring lines 16$a$ to 16$d$, electrode wiring lines 16$p$ to 16$s$, first electrodes 18$a$, 18$b$, 18$x$, and 18$y$, second electrodes 18$s$ and 18$t$, and dummy electrodes 18$p$ and 18$q$ are provided.

The first electrodes 18$a$, 18$b$, 18$x$, and 18$y$, the second electrodes 18$s$ and 18$t$, and the dummy electrodes 18$p$ and 18$q$ are pad electrodes that are coupled to the wiring line 24 provided on the one main surface 22$s$ of the substrate body 22 in the base substrate 20.

In each of the resonators 14$a$ to 14$e$, reflectors are disposed on both sides of a comb-shaped IDT electrode. An elastic wave such as a surface acoustic wave or a boundary acoustic wave propagates between the resonators.

The elastic wave filter 10 in which a Tx filter is provided is, for example, a ladder filter. That is, the resonators (series resonators) 14$a$ to 14$c$ are cascaded by the connection wiring lines (cascade connection wiring lines) 16$a$ and 16$b$. The resonators (parallel resonators) 14$d$ and 14$e$ are connected to the series resonators 14$a$ and 14$b$ by the connection wiring lines (e.g., parallel or substantially parallel connection wiring lines) 16$c$ and 16$d$, respectively.

The first electrodes 18$a$, 18$b$, 18$x$, and 18$y$ are connected to the resonators 14$a$, 14$c$, 14$d$, and 14$e$ by the electrode wiring lines 16$p$ to 16$s$, respectively. A signal is input into the first electrode 18a, and a signal is output from the first electrode 18b. The first electrodes 18x and 18y are connected to the ground.

The second electrodes 18s and 18t are disposed on the cascade connection wiring lines 16a and 16b at interstage portions that cascade the series resonators 14a and 14b and the series resonators 14b and 14c, respectively, and are in contact with the cascade connection wiring lines 16a and 16b, respectively. The second electrodes 18s and 18t are heat-dissipation dummy electrodes.

The dummy electrodes 18P and 18q are spaced apart from the resonators 14a to 14e and the wiring lines 16a to 16d and 16p to 16s. The third electrodes 18p and 18q strengthen the coupling between the elastic wave filter 10 and the base substrate 20.

As illustrated in FIG. 1, in the substrate body 22 including the laminate of a plurality of insulating layers made of, for example, ceramics in the base substrate 20, a via-hole conductor 26 passing through the insulating layers and an in-plane conductor 27 extending between the insulating layers are formed.

One (not illustrated) of the wiring lines 24 located on the one main surface 22s of the substrate body 22 is connected to the first electrodes 18a, 18b, 18x, and 18y in the elastic wave filter 10 and is electrically connected to the external terminal 29 located on the other main surface 22t of the substrate body 22 via the via-hole conductor 26 and the in-plane conductor 27. The external terminal 29 is coupled to the mount terminal 39 located on the mount surface 32s of the mount board 30. The mount terminal 39 is an input-side mount terminal, an output-side mount terminal, or a ground-side mount terminal. A wiring line that is located on the one main surface 22s of the substrate body 22 and is connected to the first electrodes 18a, 18b, 18x, and 18y in the elastic wave filter 10 is an input/output wiring line through which an input signal or an output signal propagates or a ground wiring line connected to the ground.

One of the wiring lines 24 which is located on the one main surface 22s of the substrate body 22 and is connected to the second electrodes 18s and 18t in the elastic wave filter 10 and one of the wiring lines 24 which is located on the one main surface 22s of the substrate body 22 and is connected to the dummy electrodes 18p and 18q in the elastic wave filter 10 are not electrically connected to an external terminal 29 located on the other main surface of the substrate body 22. Accordingly, these wiring lines 24 become unrelated to the potential of the mount terminal 39 of the mount board 30 and become electrically floating. The wiring lines which are located on the one main surface 22s of the substrate body 22 and are connected to the second electrodes 18s and 18t and the dummy electrodes 18p and 18q in the elastic wave filter 10 are floating wiring lines.

Since the elastic wave filter 10 can be mounted on the base substrate 20 irrespective of the potential of the mount terminal 39 of the mount board 30 on which the elastic wave apparatus 2 is mounted, the elastic wave apparatus 2 has a high degree of design flexibility.

As illustrated in FIGS. 1 and 3, the second electrodes 18s and 18t are in contact with the cascade connection wiring line 16a at the interstage portion between the cascaded resonators 14a and 14b and the cascade connection wiring line 16b at the interstage portion between the cascaded resonators 14b to 14c, respectively. Accordingly, the amount of heat transmitted from these interstage portions, which are very prone to reach high temperatures, to the second electrodes 18s and 18t is increased and a sufficient amount of heat is dissipated to the base substrate 20. That is, the amounts of heat transmitted from the interstage portion between the cascaded resonators 14a and 14b to the second electrode 18s that is in contact with the cascade connection wiring line 16a and transmitted from the interstage portion between the cascaded resonators 14b and 14c to the second electrode 18t that is in contact with the cascade connection wiring line 16b are larger than those transmitted to a dummy electrode 18u spaced apart from the cascade connection wiring line 16a at the interstage portion between the cascaded resonators 14a and 14b and transmitted to a dummy electrode 18v spaced apart from the cascade connection wiring line 16b at the interstage portion between the cascaded resonators 14b and 14c in an elastic wave apparatus 2x that is a comparative example illustrated in a cross-sectional view in FIG. 11 and a plan view in FIG. 12. Thus, a heat-dissipation effect is increased.

Figure 11:
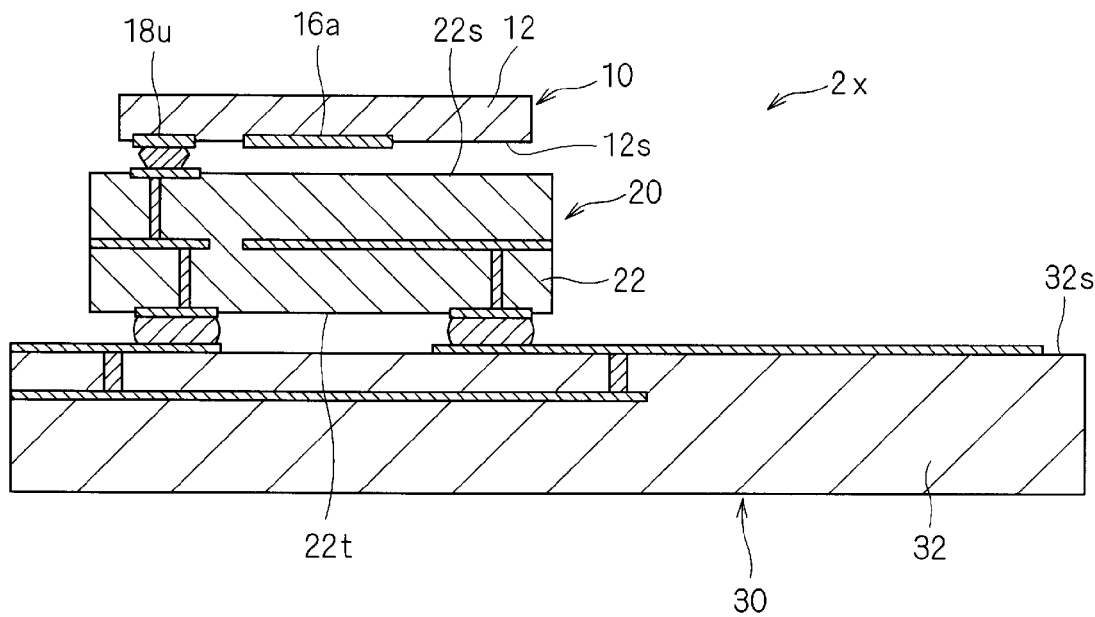
FIG. 11 is a cross-sectional view of an elastic wave apparatus mounted on a mount board according to a comparative example.
Figure 12:
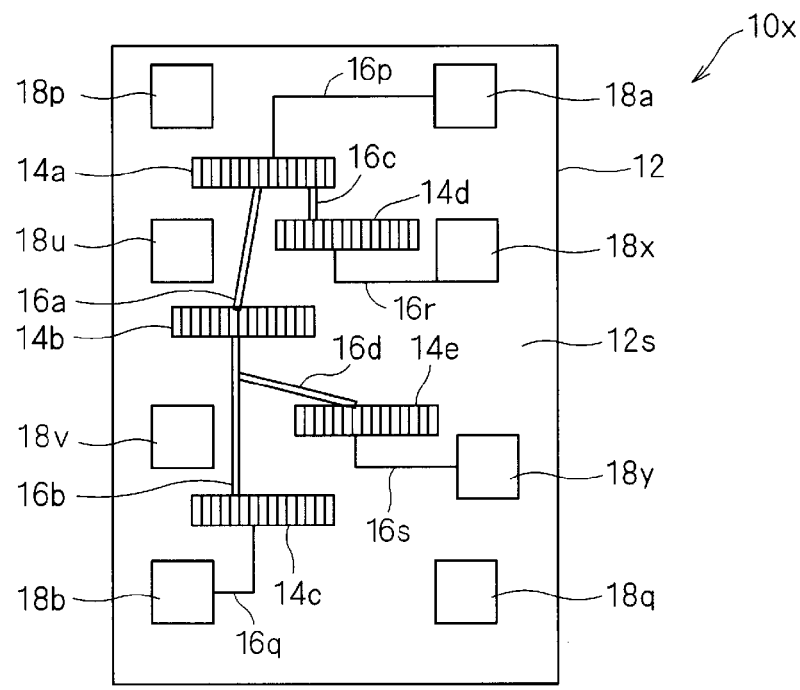
FIG. 12 is a plan view illustrating the configuration of an elastic wave filter according to a comparative example.
Figure 13:
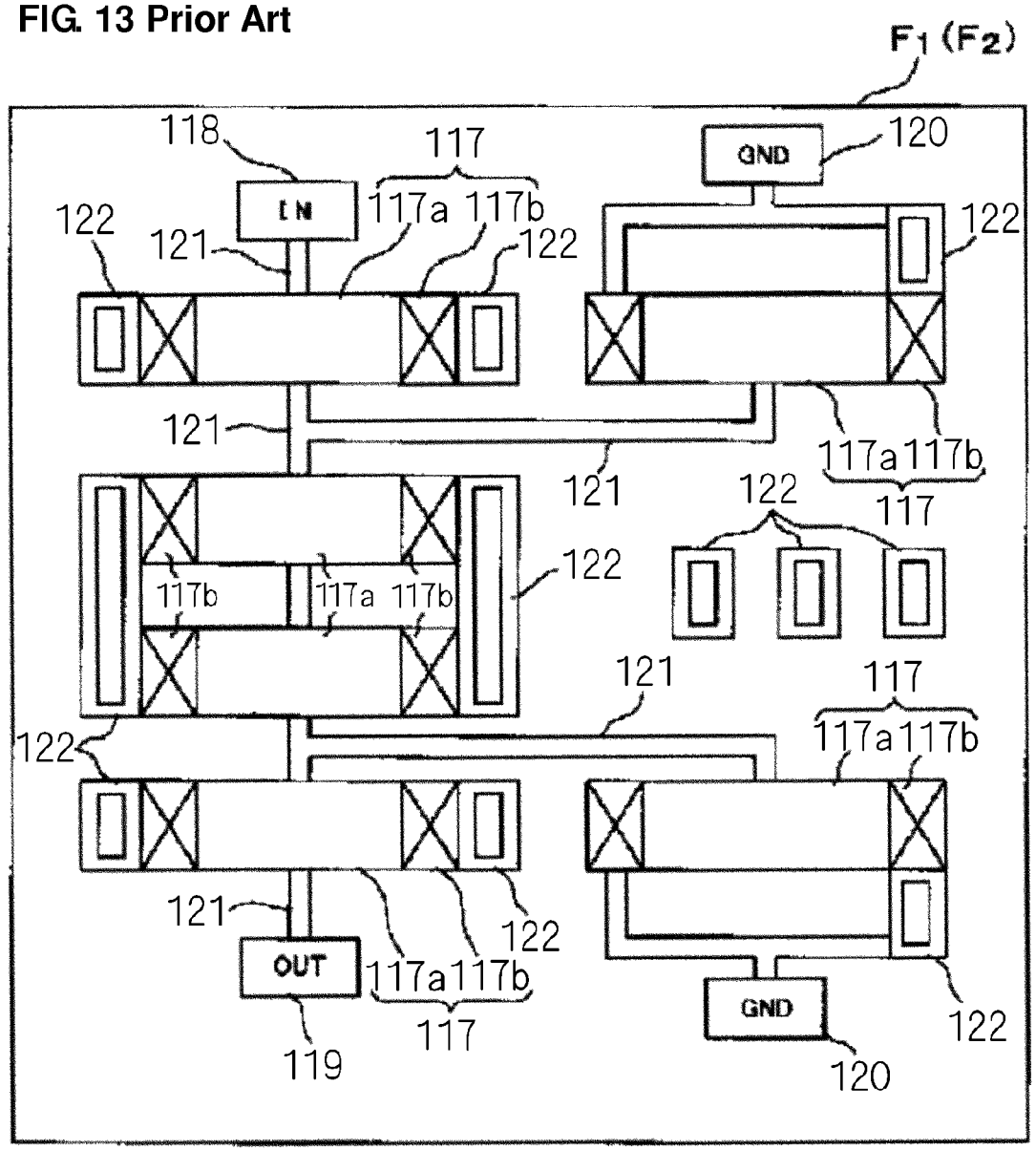
FIG. 13 is a block diagram illustrating the configuration of an elastic wave filter according to the related art.
Figure 14:
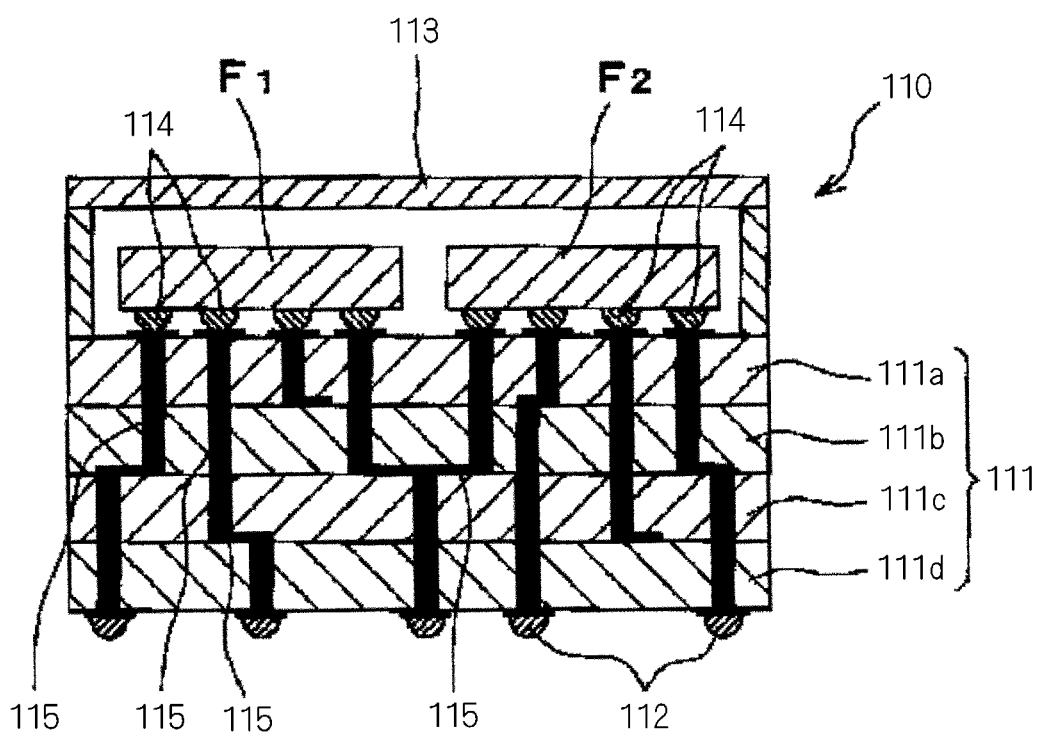
FIG. 14 is a cross-sectional view illustrating the configuration of an elastic wave apparatus according to the related art.

Since the second electrodes 18s and 18t are in contact with the cascade connection wiring line 16a at the interstage portion between the cascaded resonators 14a and 14b and the cascade connection wiring line 16b at the interstage portion between the cascaded resonators 14b to 14c, respectively, the length (in the vertical direction in FIGS. 3 and 12) and the width (in the horizontal direction in FIGS. 3 and 12) of the piezoelectric substrate 12 can be reduced and the elastic wave apparatus 2 can be reduced in size as compared with the elastic wave apparatus 2x that is an comparative example illustrated in FIGS. 11 and 12 in which the dummy electrodes 18u and 18v are spaced apart from the connection wiring line 16a at the interstage portion between the cascaded resonators 14a and 14b and the cascade connection wiring line 16b at the interstage portion between the cascaded resonators 14b and 14c, respectively. By reducing pitches among the electrodes 18a, 18b, 18p, 18q, 18s, 18t, 18x, and 18y used to couple the elastic wave filter 10 and the base substrate 20, it is possible to securely mount the elastic wave filter 10 on the base substrate 20. Furthermore, since the footprint of resonators and wiring lines can be increased without changing the size and strength of an elastic wave filter in the related art, design flexibility is increased and a wiring resistance is reduced; the filter characteristic of the elastic wave filter can be enhanced.

It is preferable to form floating wiring lines on the one main surface 22s of the substrate body 22 in the base substrate 20. In a case where electroplating is performed, all of the wiring lines 24 to be plated are preferably electrically connected on a mother substrate. Accordingly, wiring lines to be the wiring lines 24 are electrically connected via a wiring line to be the in-plane conductor 27 on a mother substrate, and are separated when the mother substrate is divided. Some of the separated wiring lines become floating wiring lines.

Next, various modifications of the first preferred embodiment will be described with reference to FIGS. 4 to 10 focusing on the difference between each of the modifications and the first preferred embodiment. The same reference numerals are used to identify elements already described in the first preferred embodiment.

First Modification

Figure 4:
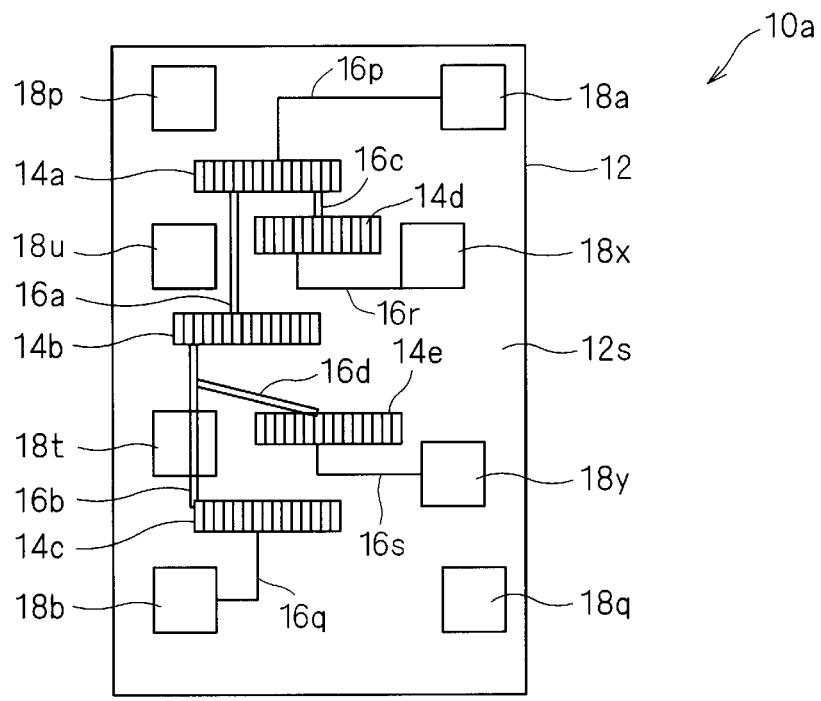
FIG. 4 is a plan view illustrating the configuration of an elastic wave filter according to a first modification of the first preferred embodiment of the present invention.

FIG. 4 is a plan view illustrating the configuration of an elastic wave filter 10a in an elastic wave apparatus that is the first modification. As illustrated in FIG. 4, in the first modification, the second electrode 18t preferably is disposed on only the cascade connection wiring line 16b at the interstage portion between the series resonators 14b and 14c (for example, an interstage portion that produces a relatively large amount of heat) and the dummy electrode 18u is spaced apart from the cascade connection wiring line 16a at the interstage portion between the series resonators 14a and 14b (for example, an interstage portion that produces a relatively small amount of heat). In this case, a heat-dissipation effect is increased with the second electrode 18t. In order to achieve further miniaturization and enhance a further heat dissipation effect, second electrodes may be provided on the parallel connection wiring lines 16c and 16d illustrated in FIGS. 3 and 4.

Second Modification

Figure 5:
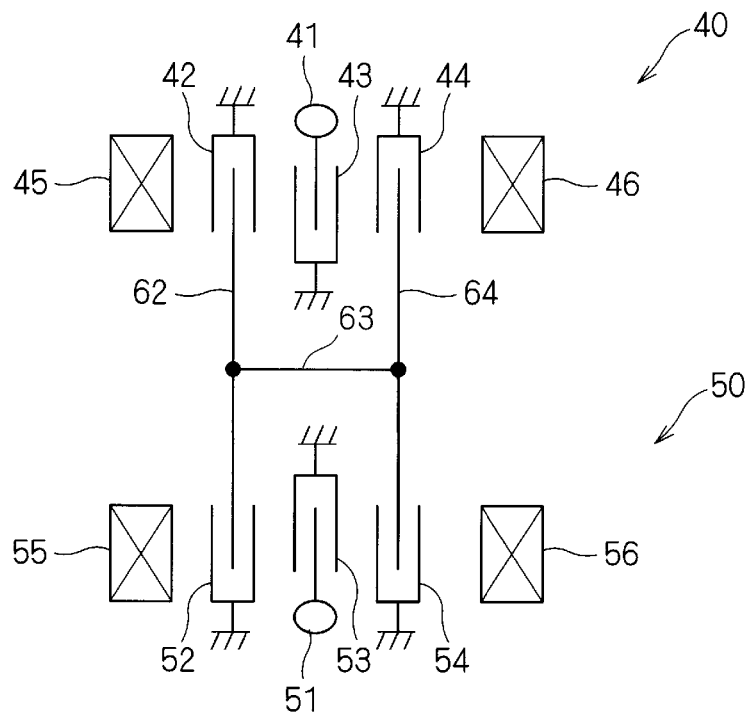
FIG. 5 is a schematic diagram illustrating the configuration of an elastic wave filter according to a second modification of the first preferred embodiment of the present invention.

An elastic wave filter provided on a base substrate may not be a ladder filter. FIG. 5 is a schematic diagram illustrating the configuration of an elastic wave filter in an elastic wave apparatus that is the second modification. As illustrated in FIG. 5, in the second modification, two filters 40 and 50 are cascaded between an input terminal 41 and an output terminal 51 on one main surface of a piezoelectric substrate in an elastic wave filter. In this case, a second electrode is arranged so that it is in contact with at least a portion of cascade connection wiring lines 62 to 64 that connect the first-stage filter 40 and the second-stage filter 50. The first-stage filter 40 includes resonators 42 to 44 and reflectors 45 and 46. The second-stage filter 50 includes resonators 52 to 54 and reflectors 55 and 56.

Third Modification

Figure 6:
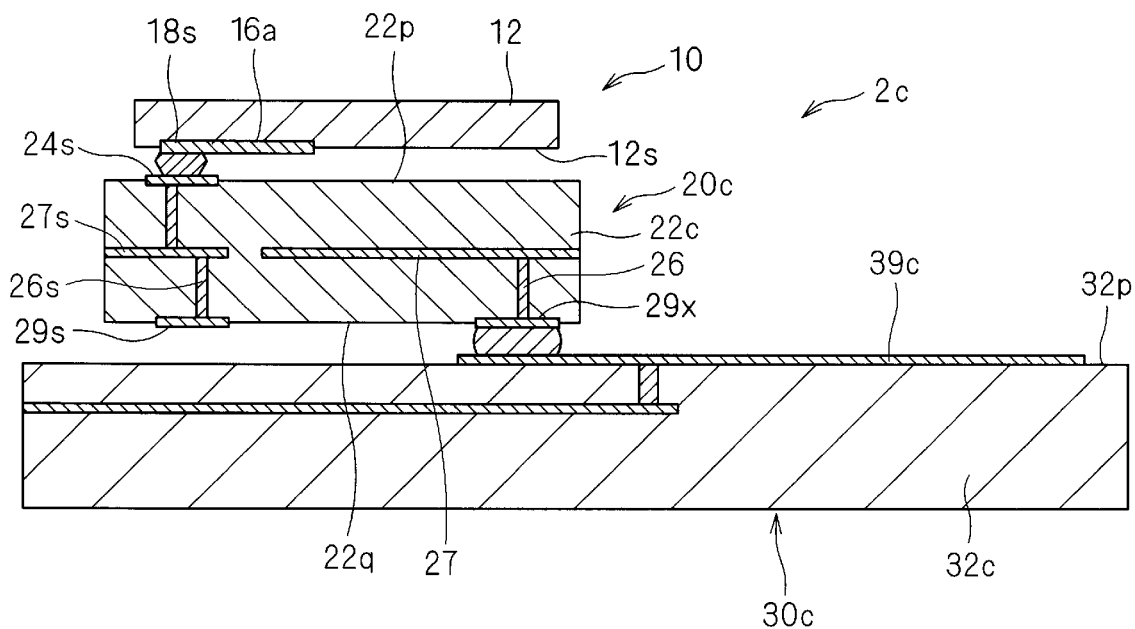
FIG. 6 is a cross-sectional view of an elastic wave apparatus mounted on a mount board according to a third modification of the first preferred embodiment of the present invention.
Figure 7:
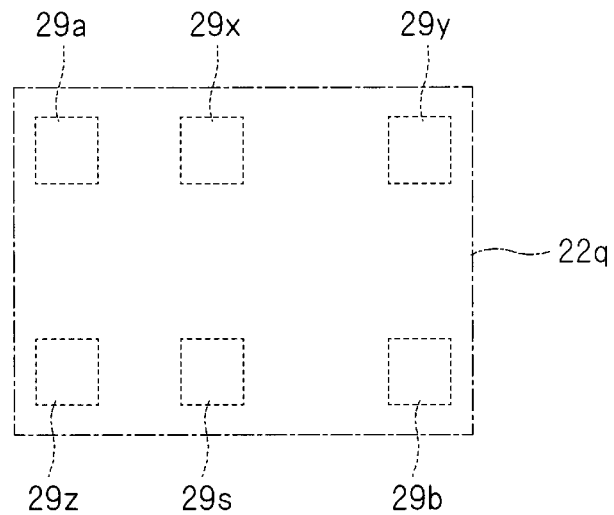
FIG. 7 is a perspective view of the other main surface of a base substrate according to the third modification of the first preferred embodiment of the present invention.
Figure 8:
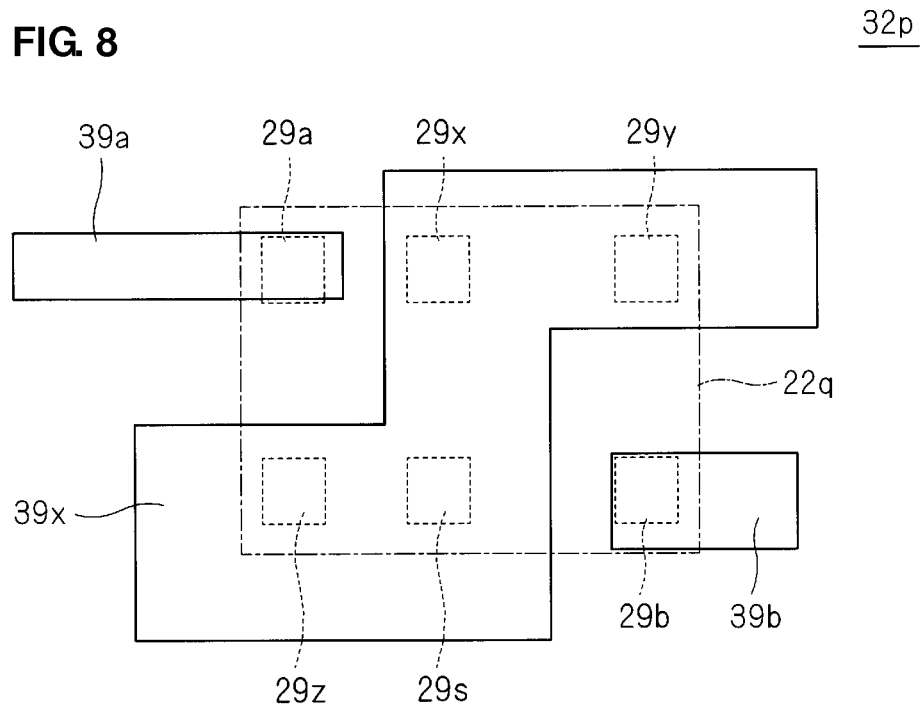
FIG. 8 is a plan view of a main portion of a mount surface of a mount board according to the third modification of the first preferred embodiment of the present invention.

An elastic wave apparatus 2c that is the third modification will be described with reference to FIGS. 6 to 8. FIG. 6 is a cross-sectional view of the elastic wave apparatus 2c mounted on a mount board 30c. FIG. 7 is a perspective view of the other main surface 22q of a substrate body 22c in the base substrate 20c. FIG. 8 is a plan view of a mount surface 32p of a substrate body 32c in the mount board 30c on which the elastic wave apparatus 2c is mounted.

As illustrated in FIG. 7, on the other main surface 22q of the substrate body 22c in the base substrate 20c, six external terminals, that is, an input terminal 29a, an output terminal 29b, ground terminals 29x, 29y, and 29z, and a floating terminal 29s, are preferably provided.

The input terminal 29a, the output terminal 29b, the ground terminals 29x, 29y, and 29z are electrically connected to an input/output wiring line or a ground wiring line (not illustrated) located on one main surface 22p of the substrate body 22c via the via-hole conductor 26 and the in-plane conductor 27 which are provided in the substrate body 22c.

As illustrated in FIG. 6, the second electrode 18s located on the one main surface 12s of the piezoelectric substrate 12 in the elastic wave filter 10 is coupled to a floating wiring line 24s located on the one main surface 22p of the substrate body 22c in the base substrate 20c, and is electrically connected to the floating terminal 29s located on the other main surface 22q of the substrate body 22c via a via-hole conductor 26s and an in-plane conductor 27s which are provided in the substrate body 22c.

The floating terminal 29s is spaced apart from a mount terminal 39c located on the mount surface 32p of the mount board 30c, and is not electrically connected to the mount terminal 39c located on the mount surface 32p of the mount board 30c.

Referring to FIG. 6, the floating terminal 29s does not face the mount terminal 39c located on the mount surface 32p of the mount board 30c. However, as illustrated in FIG. 8, the floating terminal 29s may be arranged so that it faces but is not connected to a ground-side mount terminal 39x located on the mount surface 32p of the mount board 30c.

That is, as illustrated in FIG. 8, on the mount surface 32p of the mount board 30c, an input-side mount terminal 39a connected to the input terminal 29a located on the other main surface 22q of the substrate body 22c in the base substrate 20c, an output-side mount terminal 39b connected to the output terminal 29b, and the ground-side mount terminal 39x connected to the ground terminals 29x, 29y, and 29z are provided. The floating terminal 29s faces the ground-side mount terminal 39x, but is not electrically connected to the ground-side mount terminal 39x.

In the third modification, on the other main surface 22q of the substrate body 22c in the base substrate 20c, the floating terminal 29s that is an external terminal electrically connected to the floating wiring line 24s is provided. The floating terminal 29s is spaced apart from the mount terminal 39c located on the mount surface 32p of the mount board 30c, and is insulated from the mount terminal 39c.

Since heat generated at an interstage portion between cascaded resonators in the elastic wave filter 10 can be externally dissipated from the base substrate 20c via the floating terminal 29s that is not coupled to the mount board 30c and is spaced apart from the mount board 30c, a heat-dissipation effect can be further increased.

Fourth Modification

Figure 9:
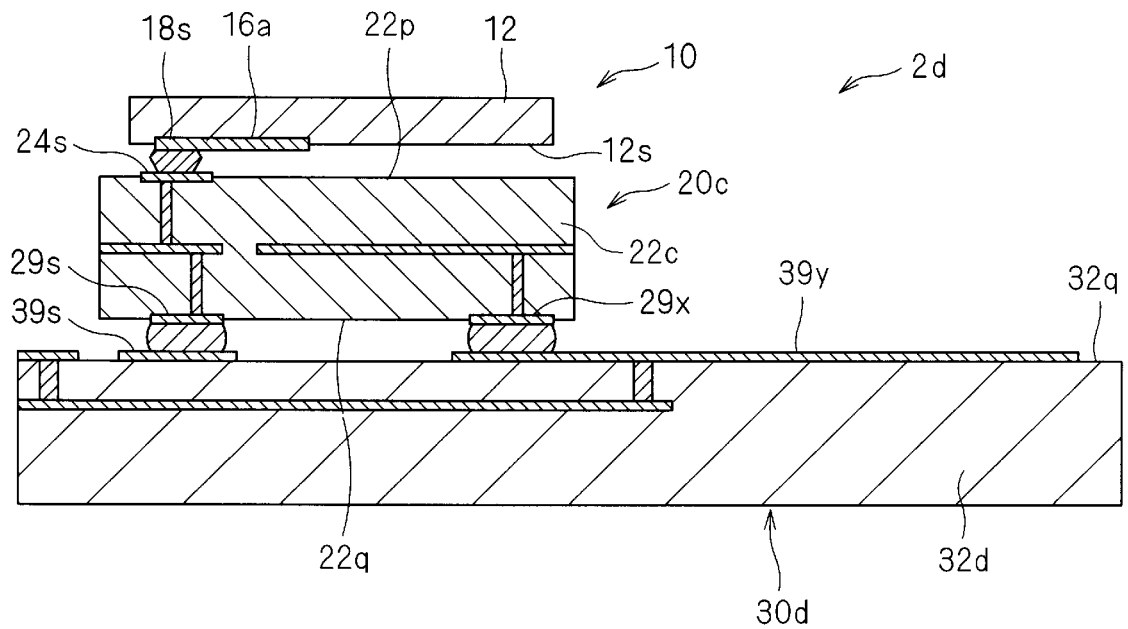
FIG. 9 is a cross-sectional view of an elastic wave apparatus mounted on a mount board according to a fourth modification of the first preferred embodiment of the present invention.
Figure 10:
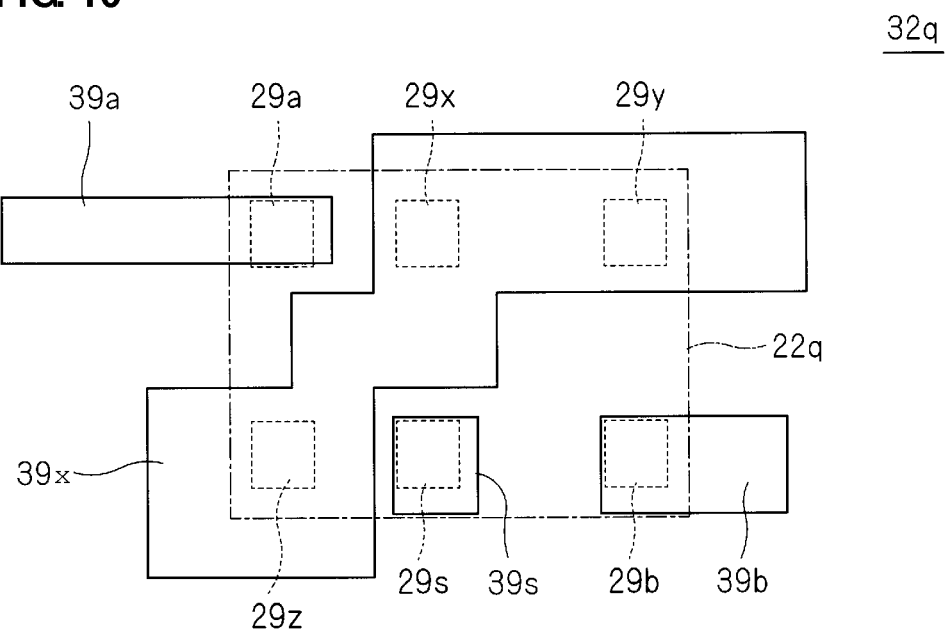
FIG. 10 is a plan view of a main portion of a mount surface of a mount board according to the fourth modification of the first preferred embodiment of the present invention.

An elastic wave apparatus 2d that is the fourth modification will be described with reference to FIGS. 9 and 10. FIG. 9 is a cross-sectional view of the elastic wave apparatus 2d that is the fourth modification mounted on a mount board 30d. FIG. 10 is a plan view of a mount surface 32q of a substrate body 32d in the mount board 30d on which the elastic wave apparatus 2d is mounted.

As illustrated in FIG. 9, the difference between the elastic wave apparatus 2d that is the fourth modification and the elastic wave apparatus 2c that is the third modification is that the floating terminal 29s located on the other main surface 22q of the substrate body 22c in the base substrate 20c, the same one as in the third modification, is coupled to a heat-dissipation mount terminal 39s located on the mount surface 32q of the mount board 30d.

As illustrated in FIG. 10, on the mount surface 32q of the mount board 30d, the input-side mount terminal 39a connected to the input terminal 29a located on the other main surface 22q of the substrate body 22c in the base substrate 20c, the output-side mount terminal 39b connected to the output terminal 29b, the ground-side mount terminal 39x connected to the ground terminals 29x, 29y, and 29z, and the heat-dissipation mount terminal 39s connected to the floating terminal 29s are provided. The heat-dissipation mount terminal 39s is spaced apart from the input-side mount terminal 39a, the output-side mount terminal 39b, and the ground-side mount terminal 39x, and is not electrically connected to them. The heat-dissipation mount terminal 39s is floating on the side of the mount board 30d.

In the fourth modification, heat generated at an interstage portion between cascaded resonators can be dissipated from the floating terminal 29s of the base substrate 20c to the mount board 30d via the heat-dissipation mount terminal 39s of the mount board 30d. As a result, a heat-dissipation effect can be further increased as compared with the third modification.

By disposing a second electrode, which is used for heat-dissipation, on a cascade connection wiring line at at least one interstage portion between cascaded resonators and connecting the second electrode to a floating wiring line that is electrically floating (i.e., is merely routed and has an unstable potential) at a base substrate, heat generated at the cascade connection wiring line, which cascades the resonators and is very prone to reach high temperatures, can be sufficiently dissipated to the base substrate. As a result, power durability is significantly enhanced. In the above-described case in which the second electrode is disposed on a cascade connection wiring line at an interstage portion between cascaded resonators, miniaturization can be more easily achieved as compared with a case in which a heat-dissipation dummy electrode is spaced apart from the cascade connection wiring line.

The present invention is not limited to the above-described preferred embodiments, and various changes can be made thereto.

For example, preferred embodiments of the present invention are useful for an elastic wave apparatus that is a duplexer since the amount of heat generated at a Tx filter to which high power is applied is large. Preferred embodiments of the present invention can also be applied to an Rx filter. In addition, preferred embodiments of the present invention can be applied not only to a duplexer but also to various filters.

In this example, similar effects can be obtained in the case of SAW and BAW. If heat generated at an interstage portion can be dissipated to a base substrate, a desired effect can be obtained without having to provide an electrode at the base substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave apparatus comprising:
 a base substrate including, on one main surface of a substrate body, an input/output wiring line through which an input signal or an output signal propagates, a ground wiring line connected to a ground, and a floating wiring line insulated from the input/output wiring line and the ground wiring line; and
 an elastic wave filter including, on one main surface of a piezoelectric substrate, a first electrode electrically connected to the input/output wiring line or the ground wiring line located at the base substrate, a second electrode electrically connected to the floating wiring line located at the base substrate, a plurality of resonators, a connection wiring line that cascade connects the plurality of resonators, and an electrode wiring line that electrically connects one of the plurality of resonators and the first electrode; wherein
 the second electrode is in contact with the connection wiring line that cascades the plurality of resonators; and
 the second electrode is directly coupled to the floating wiring line via a conductive bump.

2. The elastic wave apparatus according to claim 1, wherein the elastic wave filter includes a ladder filter located on the one main surface of the piezoelectric substrate.

3. The elastic wave apparatus according to claim 1, wherein the elastic wave filter includes a transmission filter located on the one main surface of the piezoelectric substrate.

4. The elastic wave apparatus according to claim 1, wherein an external terminal is provided on the other main surface of the substrate body in the base substrate, and the external terminal is electrically connected to the input/output wiring line or the ground wiring line and is insulated from the floating wiring line.

5. The elastic wave apparatus according to claim 1, wherein a first external terminal and a second external terminal are located on the other main surface of the substrate body in the base substrate, and the first external terminal is electrically connected to the input/output wiring line or the ground wiring line, the second external terminal is electrically connected to the floating wiring line, and the first external terminal and the second external terminal are insulated from each other.

* * * * *